(12) United States Patent
Nakagawa et al.

(10) Patent No.: US 6,211,038 B1
(45) Date of Patent: *Apr. 3, 2001

(54) SEMICONDUCTOR DEVICE, AND METHOD FOR MANUFACTURING THE SAME

(75) Inventors: Katsumi Nakagawa, Nara; Takao Yonehara, Atsugi; Shoji Nishida, Fujisawa; Kiyofumi Sakaguchi, Yokohama; Yukiko Iwasaki, Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,325

(22) Filed: Mar. 25, 1998

(30) Foreign Application Priority Data

Mar. 27, 1997 (JP) .................................................. 9-075544

(51) Int. Cl.[7] ................................................. H01L 21/76
(52) U.S. Cl. ......................... 438/409; 438/482; 257/52; 257/64
(58) Field of Search .................................. 438/409, 482; 257/52, 64

(56) References Cited

U.S. PATENT DOCUMENTS

| | | | |
|---|---|---|---|
| 5,250,460 | * 10/1993 | Yamagata et al. | 438/406 |
| 5,466,631 | * 11/1995 | Ichikawa et al. | 438/409 |
| 5,543,648 | 8/1996 | Miyawaki | 257/347 |
| 5,811,348 | 9/1998 | Matsushita et al. | 438/455 |
| 5,856,229 | * 1/1999 | Sakaguchi et al. | 438/409 |
| 5,869,387 | 2/1999 | Sato et al. | 438/459 |

FOREIGN PATENT DOCUMENTS 6-45622   2/1994   (JP) .

OTHER PUBLICATIONS

P. Schmuki, "Initiation and Formation of Porous GaAs", J. Electrochem. Soc., vol. 143, No. 10, pp. 3316–3322 (1996).
R. Herino, "Porosity and Pore Size Distributions of Porous Silicon Layers", J. Electrochem. Soc., vol. 134, No. 7, pp. 1994–2000 (1987).

* cited by examiner

Primary Examiner—Charles Bowers, Jr.
Assistant Examiner—David S Blum
(74) Attorney, Agent, or Firm—Fitzpatrick, Cella, Harper & Scinto

(57) ABSTRACT

A method for manufacturing a thin-film crystalline solar cell includes the steps of (i) forming a porous layer including a large number of fine pores in a surface portion of a crystalline substrate, (ii) transforming a part of the porous layer including the surface thereof into a smooth layer which does not include fine pores by providing the porous layer with excitation energy, and (iii) peeling the smooth layer from the substrate. The excitation energy is provided, for example, by performing heat treatment in a hydrogen atmosphere, irradiating with light having a wavelength equal to or less than 600 nm, or irradiating with an electron beam. It is thereby possible to form a thin-film crystalline semiconductor layer on an inexpensive and flexible substrate by simple processes.

13 Claims, 5 Drawing Sheets

SEMICONDUCTOR DEVICE, AND METHOD FOR MANUFACTURING THE SAME

BACKGROUND OF THE INVENTION

1. Field of the Invention

The present invention relates to a semiconductor device, and a method for manufacturing such a device. More particularly, the invention relates to a semiconductor device, such as a high-performance thin-film crystalline solar cell using a thin-film crystal which can be formed on a low-cost substrate, and to a method for manufacturing such a device.

2. Description of the Related Art

Solar cells (solar cell devices) are widely being studied as energy sources for driving various kinds of apparatuses or as electric power supplies subjected to system interconnection with commercial electric power. It is desirable for a solar cell device to be formed on a low-cost substrate in order to reduce production cost. Silicon is generally used as a semiconductor constituting a solar cell. Particularly, single-crystal silicon is superior from the viewpoint of efficiency in converting optical energy into electric power, i.e., the photoelectric conversion efficiency. On the other hand, amorphous silicon is advantageous from the viewpoint of providing a large area and a low cost. Recently, polycrystalline silicon has come to be used in order to obtain a cost as low as amorphous silicon and an energy conversion efficiency as high as single-crystal silicon.

In methods for manufacturing semiconductor devices using single-crystal or polycrystalline silicon, it is difficult to reduce the device's thickness to a value less than 0.3 mm because a plate-shaped substrate is provided by slicing a bulk crystal. A substrate obtained by slicing a bulk crystal has generally a thickness greater than a thickness necessary for absorbing incident light (20 $\mu$m–50 $\mu$m), so the material is not efficiently utilized in the direction of the thickness. Recently, a method for forming a silicon sheet according to a spinning method in which a fused silicon liquid is poured into a mold has been proposed. Nevertheless, the minimum thickness obtained in this method is about 0.1 mm–0.2 mm. Accordingly, there is still room for further decreasing the thickness of silicon to reduce the amount of silicon and realize a low cost. If the thickness of crystalline silicon is reduced, it is possible to reduce the weight of a semiconductor device, such as a solar cell or the like, to provide a flexible device if necessary, and to widen the range of application. Particularly when using silicon for a solar cell, a thin crystal is more resistant to shock from the outside, such as hail or the like, than a thick crystal, and is therefore preferable from the viewpoint of increasing reliability in practical application.

As described above, a technique for providing a high-quality thin crystal, particularly a single crystal, which allows the manufacture of a semiconductor device, such as a solar cell or the like, having a high performance with a low cost is desired.

SUMMARY OF THE INVENTION

The present invention has been made in consideration of the above-described circumstances.

It is an object of the present invention to provide a method for manufacturing a high-quality and thinner semiconductor device.

It is another object of the present invention to provide a method for manufacturing a semiconductor device having a thin semiconductor layer with a lower cost.

It is still another object of the present invention to provide a method for manufacturing a semiconductor device, such as a solar cell or the like, with a lower cost by effectively utilizing a crystalline substrate by utilizing a material obtained by slicing the crystalline substrate to a necessary thickness for forming a flat layer, serving as a thin crystalline layer.

It is yet another object of the present invention to provide a high-performance (for example, high-efficiency in the case of a solar cell) semiconductor device having a thin crystalline semiconductor layer on an inexpensive flexible substrate which can be applied to various applications.

According to one aspect, the present invention which achieves these objectives relates to a method for manufacturing a semiconductor device including the steps of (a) forming a porous layer including a large number of fine pores in a surface portion of a crystalline substrate to a predetermined thickness, (b) transforming a part of the porous layer including the surface thereof into a crystalline smooth layer which does not substantially include fine pores, and (c) peeling the smooth layer from the crystalline substrate at a portion of the porous layer which has not been transformed into the smooth layer.

The method preferably includes the step of forming a semiconductor junction within the smooth layer before peeling the smooth layer from the crystalline substrate. It is also preferable to include the step of forming a semiconductor junction by forming a crystalline layer having a conductivity type different from the conductivity type of the smooth layer on the surface of the smooth layer before the peeling step. The step of forming the semiconductor junction preferably includes thermal diffusion of a dopant from the surface of the smooth layer. The formation of the crystalline layer having the conductivity type different from the conductivity type of the smooth layer includes a liquid-phase growth method.

It is also preferable that the step of transforming the porous layer into the smooth layer includes heat treatment in a hydrogen atmosphere or changes the sizes of the fine pores from the crystalline substrate toward the surface of the porous layer or includes energy radiation from the surface of the porous layer. The energy radiation preferably includes an electromagnetic wave having a wavelength equal to or less than 600 nm or an electron beam. The semiconductor device may be a solar cell.

In addition to the above-described steps (a)–(c), the method may also include the step of (d) bonding grid wires on the semiconductor of the smooth layer peeled from the crystalline substrate and laminating an anti-reflection layer and a lamination layer on the grid wires, and further the step of (e) bonding a metallic plate on the back of the peeled smooth layer. The crystalline substrate from which the smooth layer has been peeled may be again utilized as the crystalline substrate in the above-described step (a).

The foregoing and other objects, advantages and features of the present invention will become more apparent from the following description of the preferred embodiments taken in conjunction with the accompanying drawings.

DESCRIPTION OF THE PREFERRED EMBODIMENTS

A description will now be provided of a semiconductor device and a method for manufacturing the device according to the present invention with reference to the drawings whenever necessary. The present invention is not limited to the following description and drawings, but may, of course, be appropriately modified and combined within the spirit of the present invention.

Figure 1A:
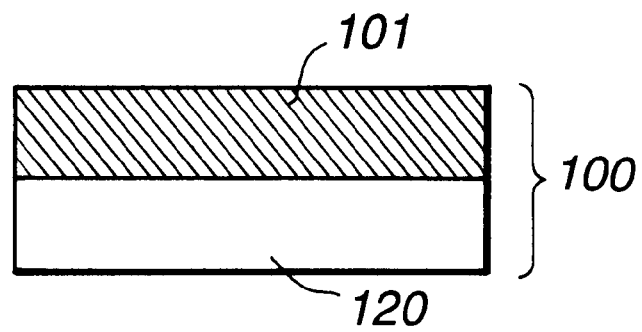
FIGS. 1(a)–1(d) are diagrams illustrating principal processes for manufacturing a solar cell according to a first embodiment of the present invention.
Figure 1B:
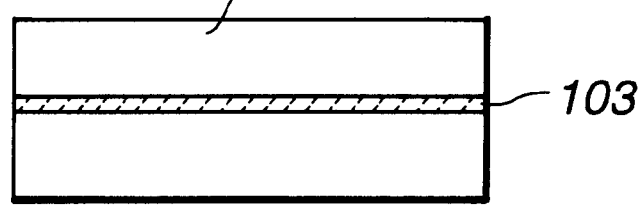
Figure 1C:
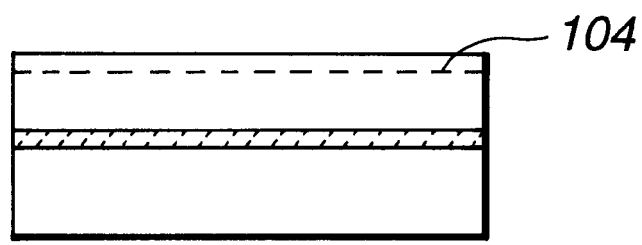
Figure 1D:
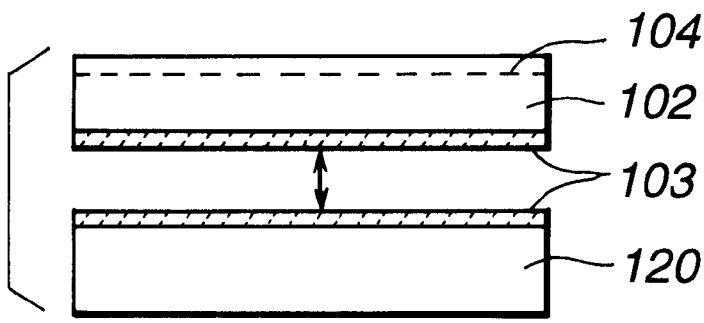
Figure 2A:
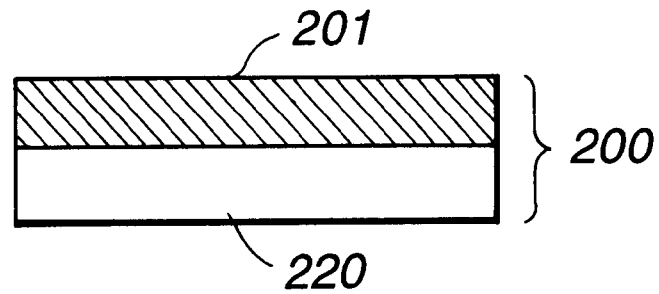
FIGS. 2(a)–2(d) and 3(a)–3(d) are diagrams each illustrating principal processes for manufacturing a solar cell according to a second embodiment of the present invention.
Figure 2B:
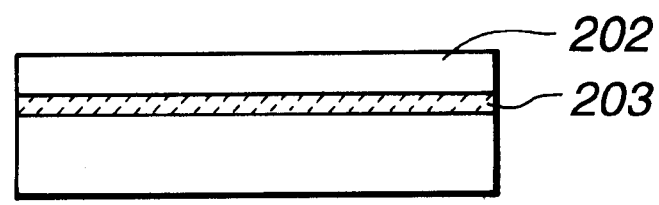
Figure 2C:
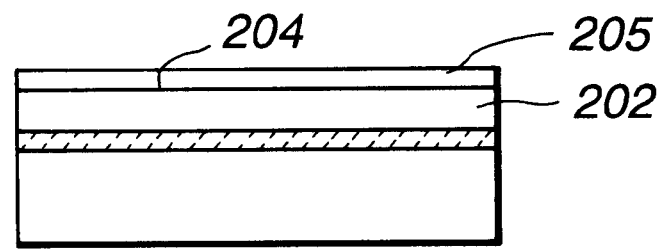
Figure 2D:
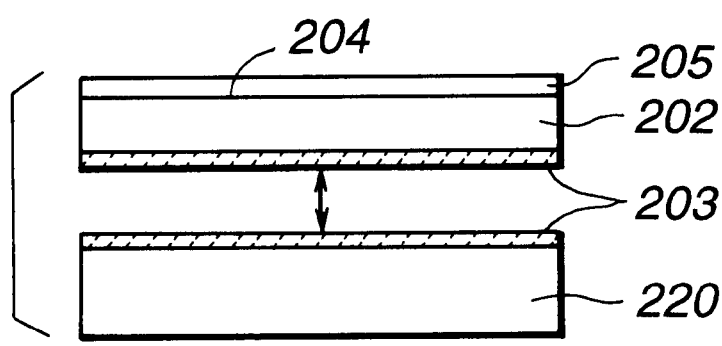
Figure 3A:
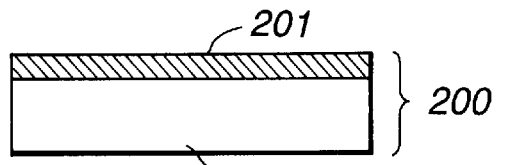
Figure 3B:
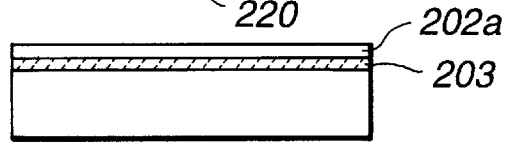
Figure 3C:
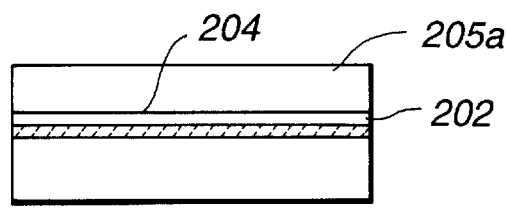
Figure 3D:
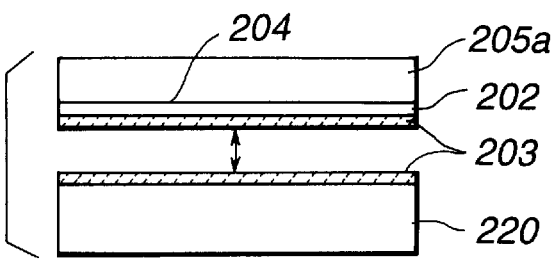

A method for manufacturing a semiconductor device according to a first embodiment of the present invention will now be described with reference to schematic cross-sectional views shown in FIGS. 1(a)–1(d). The semiconductor device manufacturing method of the first embodiment includes at least:

(a) a process of forming a porous layer 101 including a large number of fine pores in a surface portion of a crystalline substrate 100 to a predetermined thickness (FIG. 1(a)), (b) a process of transforming a portion of the porous layer 101 including the surface thereof into a crystalline smooth layer 102 which does not substantially include fine pores (FIG. 1(b)), (c) a process of peeling the smooth layer 102 from the crystalline substrate 100 at a portion 103 of the porous layer which has not been transformed into the smooth layer 102 (FIG. 1(d)).

After peeling the smooth layer 102, a crystalline layer (substrate layer) 120 of the substrate 100 which has not been transformed into the porous layer 101 remains.

In FIG. 1(c) between FIGS. 1(b) and 1(d), a process of forming a semiconductor junction 104 within the smooth layer 102 is illustrated.

In the porous layer 101, a plurality of fine vertically-long pores extending from the surface communicate with one another. In the smooth layer 102, fine pores are absent or independently present.

The apparent number of pores observed in a cross-sectional SEM (scanning electron microscope) photograph with a magnification of 100,000 is preferably at least $1 \times 10^{11}/cm^2$ in the porous layer 101 and is preferably equal to or less than $1 \times 10^{10}/cm^2$, more preferably, $1 \times 10^9/cm^2$, and still more preferably, equal to or less than $1 \times 10^8/cm^2$ in the smooth layer 102.

When manufacturing a solar cell as the semiconductor device, the semiconductor junction 104 may be a junction for obtaining an electromotive force of the solar cell (for example, a pn junction).

The present invention will now be described illustrating a method for manufacturing a solar cell as the semiconductor device. However, the present invention is not limited to a method for manufacturing a solar cell.

Important points in the above-described processes will now be described. The fact that, when the crystalline substrate 100 of Si, GaAs or the like is immersed in a solution of hydrofluoric acid and current is passed by using the substrate as an anode, the crystal is eroded by very fine pores of about 10 nm formed therewithin and the number of the fine pores increases in the direction of the thickness of the crystal in the course of time, is widely known and is described, for example, in R. Herino, G. Bomchil, K. Barla and C. Bertrand, J. Electrochem. Soc., Vol. 134, pp. 1994–2000 (1987), and P. Schmuki, J. Fraser, C. M. Vitus, M. J. Graham and H. S. Isaacs, J. Electrochem. Soc., Vol., 143, pp. 3316–3322 (1996). In the description of the present invention, such an electrochemical method is termed anodic forming, and a layer including a large number of fine pores formed according to anodic forming or the like is termed a porous layer.

The porous layer 101 shown in FIG. 1(a) has a very irregular form when being observed under a SEM and has a weak structure. Hence, it is possible to peel the porous layer 101 from the substrate layer 120 present therebelow as a thin film by applying a force from the outside.

However, since the rate of recombination of carriers in the surfaces of fine pores is large, it is impossible to utilize the porous layer 101 as a material for forming an electronic device. Nevertheless, since the porous layer 101 has the property of a single crystal from the viewpoint of crystallography, it is possible, for example, to perform epitaxial growth on the porous layer 101.

Utilizing this fact, for example, in Japanese Patent Laid-Open Application (Kokai) No. 6-45622 (1994), a method is disclosed for manufaturing a thin-film crystalline solar cell in which a porous silicon layer is formed in a surface portion of a silicon wafer by anodic forming and is then peeled, and after fixing the peeled porous layer on a metallic substrate, an epitaxial layer is formed to provide a solar cell using this epitaxial layer.

However, the inventors of the present application have found that a smooth layer obtained by transforming a porous layer by providing exciting energy thereon substantially succeeds the crystallinity of the original single-crystal substrate to provide high quality to allow formation of a solar cell and can be grown to a thickness necessary for a solar cell. Thermal energy or optical energy can be utilized as means for providing such a transformed material. Furthermore, the formation of such a layer can be accelerated by providing the exciting energy in a hydrogen atmosphere. The inventors currently believe that, since the porous layer 101 is less stable in energy than the smooth layer 102 which does not include fine pores due to the surface energy of fine pores within the porous layer 101, the porous layer 101 is transformed into the smooth layer 102 which is stable when bonding between atoms constituting the porous layer 101 is loosened by providing excitation energy. Particularly when hydrogen is combined with atoms constituting the crystal, bonding between crystal atoms is expected to be destabilized to enhance the effect of providing the excitation energy. At that time, since the porous layer 101 holds the crystallinity of the original crystalline substrate 100, the smooth layer 102 is expected to also succeed the crystallinity of the original crystalline substrate 100.

By thus forming the smooth layer 102 while leaving a part of the porous layer 101, it is possible to peel a very thin crystalline film which is very useful as a semiconductor layer of a semiconductor device.

Figure 4:
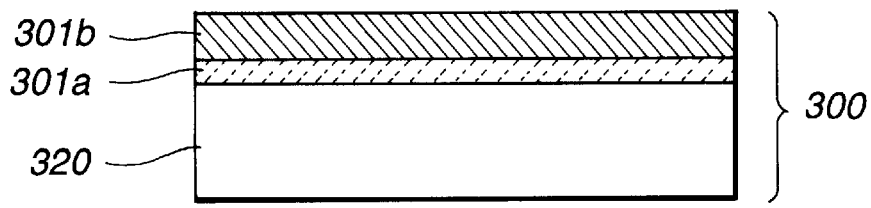
FIG. 4 is a schematic diagram illustrating the structure of a porous layer which can be peeled.

When the porous layer 101 is completely transformed into the smooth layer 102 as a result of too much executing the above-described method, a substrate which is the same as the original crystalline substrate is, in some cases, obtained, so that a thin layer cannot be peeled. In consideration of such a problem, it is desirable to change porosity which serves as an index indicating the size, such as the diameter, or the number of fine pores of the porous layer 101 from the surface side toward the back side of the substrate 100. FIG. 4 shows an example of such an approach. In FIG. 4, a substrate 300 comprises a crystalline layer (substrate layer) 320, a porous layer 301a and a smooth layer 301b. In the smooth layer 301b formed in a surface portion of the substrate 300, the sizes of fine pores are sequentially reduced from the porous layer 301a below the smooth layer 301b. According to this configuration, while the smooth layer 301b is completely smoothed when the same excitation energy is provided, considerably large pores remain within the porous layer 301a, so that the smoothed smooth layer 301b can be peeled from the portion of the porous layer 301a. It is believed that this is because when fine pores are large, the surface energy decreases, so that the difference in stability between the porous layer 301a and the smooth layer 301b is small to weaken the force to accelerate transformation.

In order to form a porous layer having such a configuration, for example, conditions for anodic forming may be changed in the midst of the anodic forming. Observation under a SEM indicates that if other conditions are equal, the sizes of fine pores increase as the concentration of hydrofluoric acid decreases. The sizes of fine pores increase as the current of anodic forming increases. Accordingly, for example, anodic forming may be performed with a low-concentration hydrofluoric acid after performing anodic forming with high-concentration hydrofluoric acid, or anodic forming may be performed with a large current after performing anodic forming with a small current.

Figure 5:
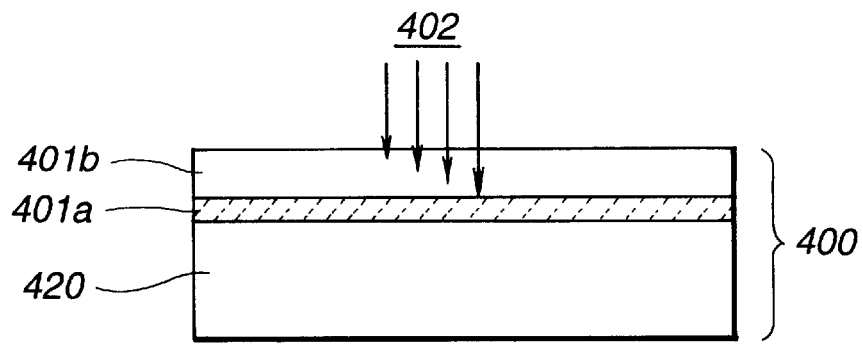
FIG. 5 is a diagram illustrating a method for forming the porous layer shown in FIG. 4.

As in the case of a substrate 400 shown in FIG. 5, even if the sizes of fine pores in a porous layer 401a are constant, it is possible to leave the portion of the porous layer 401a in the backside thereof by subtantially transforming a surface-side portion of the porous layer 401a into a smooth layer 401b by making excitation energy stronger toward the surface side of the porous layer 401a. For that purpose, energy radiation 402 may be provided from the surface side of the substrate 400. An electromagnetic wave, particularly, radiation having a short wavelength which is strongly absorbed by a substance, or an energy corpuscular beam having a strong interaction with a substance, such as an electron beam, is mostly absorbed in the vicinity of the surface of the substance, so that the function of transformation is weakened at the backside of the substance. Hence, such radiation is effective as an excitation energy source used in the present invention. According to the knowledge of the inventors, for example, a light source strongly radiating light having a wavelength shorter than 600 nm (including ultraviolet light) is suitable as such an excitation energy radiation source, so that a xenon lamp, an excimer laser, a YAG laser (utilizing second or higher harmonics), or the like may be utilized. Radiation of an electron beam using an electron gun provided within a chamber which can be evacuated to vacuum may also be suitably used.

In order to cause a crystalline layer to operate as a solar cell, it is necessary to form at least one semiconductor junction. The most general method for that purpose is thermal diffusion of an appropriate dopant.

In FIGS. 1(c) and 1(d), an example of forming the semiconductor junction 104 by performing thermal diffusion from the surface of the smooth layer 102 is shown. For example, if the smooth layer 102 is a p⁻ layer, an n-type dopant may be diffused from the surface of the smooth layer 102 to provide an n⁺-type layer at the surface side of the smooth layer 102 (the process (c)), and then the smooth layer 102 where the semiconductor junction 104 has been formed may be peeled from the substrate 100 (the process (d)).

As shown in FIGS. 2(a)–2(d) and 3(a)–3(d), it is also possible to form a semiconductor junction 204 by growing a crystalline layer 205 whose conductivity type is different from the conductivity type of a smooth layer 202 on the surface of the smooth layer 202. In the configuration shown in FIGS. 2(a)–2(d), the crystalline layer 205 having the different conductivity type is made to be thinner than the smooth layer 202, so that this structure is suitable when sunlight is incident upon the crystalline layer 205. On the other hand, in the configuration shown in FIGS. 3(a)–3(d), a crystalline layer 205a having a different conductivity type is made to be thicker than the smooth layer 202, so that this structure is suitable when sunlight is incident upon the smooth layer 202. One of the configurations shown in FIGS. 2(a)–2(d) and 3(a)–3(d) may be selected depending on production processes of a solar cell module. In the configuration shown in FIGS. 3(a)–3(d), since the crystalline layer 205a is thick, there may arise, for example, the problems that much time is required for growing the crystalline layer 205a in a vapor phase growth method using gases such as silane, dichlorosilane, trichlorosilane or the like, that the number of substrates processed in a batch cannot be increased, and that the gases are expensive. Hence, the configuration shown in FIGS. 2(a)–2(d) is preferable.

From such a viewpoint, a liquid phase growth method in which silicon grains are melted in a fused metal, such as Sn, In, Cu, Al or the like, a crystalline substrate is then immersed in the solution, and silicon is grown on the substrate by making the solution supersaturated is advantageous. In the liquid phase growth method, it is possible to increase the growth speed and the number of substrates processed in a batch. In addition, materials used are inexpensive and are not wasted to a large degree.

After completing the above-described processes (a)–(d), the substrate layers (crystalline layers) 120 arid 220 remaining after peeling the surface-side porous layers are subjected to appropriate surface treatment, such as etching or the like and are then returned to the process (a) in order to use them as subtrates 100 and 200, respectively, and to form porous layers thereon. They can be repeatedly used in the same manner. Hence, the cost of the crystalline substrate is reduced.

In FIGS. 1(a)–1(d), 2(a)–2(d) and 3(a)–3(d), in order to facilitate understanding, the thicknesses of the porous layers 101 and 201 are shown to be about half the thicknesses of the substrates 100 and 200, respectively. Actually, however, the thicknesses of the porous layers 101 and 201, i.e., the thicknesses reduced at single processing of manufacturing solar cells, are about tens of micrometers to a few micrometers which equal about one to tens to hundreds of the thicknesses of the substrates 100 and 200, respectively. Hence, the substrate can be repeatedly used a large number of times.

Although the thicknesses of the crystalline substrates 100 and 200 are reduced as the substrates 100 and 200 are repeatedly used, the reduced amount can be restored by growing a crystalline layer on the substrate after performing surface treatment according to the liquid phase growth method or the like, so that the crystalline substrate can be repeatedly used tens to hundreds of times.

As described above, according to the present invention, when manufacturing high-performance solar cells, it is possible to use an expensive single-crystal substrate while slicing it to a substantially necessary thickness. Hence, the cost of material for solar cells can be reduced. Furthermore, while using the sliced portion as a part of a semiconductor junction, the reduced thickness of the single-crystal substrate can be restored according to the liquid phase growth method which has an excellent mass production capability. Hence, the cost of material can be greatly reduced. In this case, since it is unnecessary to newly perform junction formation such as thermal diffusion of a dopant, the process can be simplified.

Examples of methods for manufacturing thin-film crystalline solar cells will now be described in detail. However, the gist of the present invention is as described above, and the present invention is not limited to the following examples.

EXAMPLE 1

In Example 1, solar cells were manufactured according to the manufacturing method shown in FIGS. 1(a)–1(d). The manufacturing processes will now be described in detail with reference to FIGS. 6(a)–6(h).

Process (a)

A $p^+$ layer was formed in a single-crystal silicon wafer (substrate) 100 having a thickness of 500 $\mu$m by performing thermal diffusion of boron (B) at 1200° C. using $BCl_3$ as a thermal diffusion source. By forming in advance the $p^+$ layer on a crystalline substrate layer 120, a porous layer 101 having a desired shape is obtained by anodic forming. The $p^+$ layer was subjected to anodic forming in an HF solution under the conditions shown in Table 1 to form the porous silicon layer 101 having a shape corresponding to the shape of the $p^+$ layer (FIG. 6(a)).

Table 1

Anodic forming solution: $HF:H_2O:C_2H_5OH=1:1:1$
Current density: 5 mA/cm$^2$→30 mA/cm$^2$
Time period of anodic forming: 20 min→20 sec Process (b)

Then, the silicon wafer 100 was subjected to heat treatment in a hydrogen atmosphere. First, the wafer 100 was disposed in a quartz tube and was subjected to heat treatment for 30 minutes by raising the temperature to 1,050° C. in an atmospheric pressure hydrogen gas flow. The cross-section of the wafer 100 was observed under a SEM with a magnification of 100,000 before and after the heat treatment in order to see a change in the shape of the porous layer 101. Before the heat treatment, growth of fine pores having diameters of about 10 nm in the direction of the depth of the wafer was observed in a region from the surface to a depth of at least 20 $\mu$m of the wafer. Particularly, in a portion having a thickness of about 0.5 $\mu$m at the deepest portion of the region, it was observed that the diameters of pores were at least twice the diameters of pores in other portions and voids expanded. It is believed that such large-diameter pores were formed when increasing the current density to 30 mA/cm$^2$ in the process of anodic forming. After the heat treatment, while fine pores were observed in a portion 103 where the diameters of fine pores were initially large, fine pores were not observed in another portion 102. Thus, the smooth layer 102 was formed (FIG. 6(b)). In the portion 103 where the diameters of fine pores were large, initial irregular shapes were transformed into substantially smooth roundish shapes. The crystallinity of the smooth layer 102 was confirmed by electron diffraction to be a single crystal having the same orientation as the substrate 100.

The smooth layer 102 formed in the above-described manner was peeled by attaching an adhesive tape on the surface thereof, and the resistivity of the smooth layer 102 was measured to be about 0.1 Ωcm. While the porous layer 101 was originally formed by the $p^+$ layer, the resistivity of the smooth layer 102 was slightly higher than the resistivity of the ordinary $p^+$ layer. This suggests the possibility that the dopant migrated into the smooth layer 102 in the course of transformation into the smooth layer 102 to provide a low concentration.

However, the above-described smooth layer is relatively low in function as a $p^-$ layer used for a semiconductor junction for a solar cell. Hence, when performing heat treatment, phosphine ($PH_3$) having a concentration of 2 ppm was mixed in a hydrogen gas flow in order to provide a layer which is closer to an intrinsic layer, and a resistivity of 2 Ωcm was obtained. The smooth layer 102 obtained under this condition was hereafter used.

Process (c)

Figure 6A:
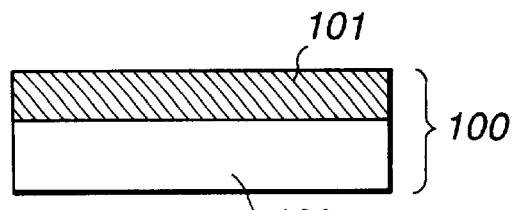
FIGS. 6(a)–6(h) are diagrams illustrating the entire processes for manufacturing a solar cell according to the first embodiment.
Figure 6B:
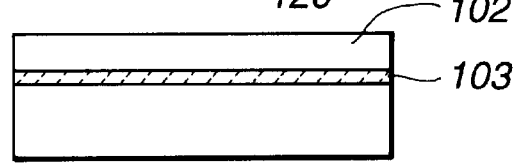
Figure 6C:
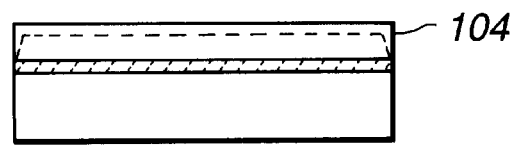
Figure 6D:
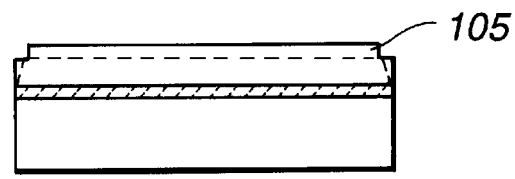
Figure 6E:
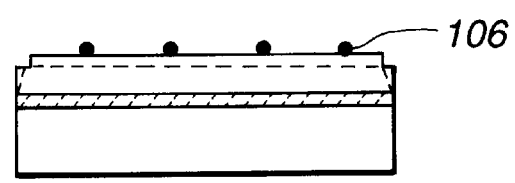
Figure 6F:
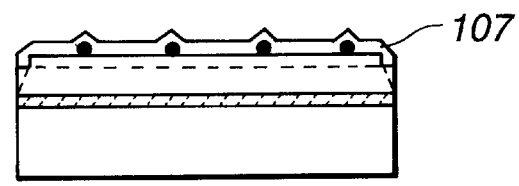
Figure 6G:
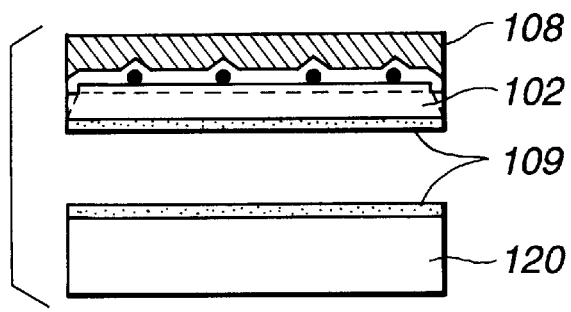
Figure 6H:
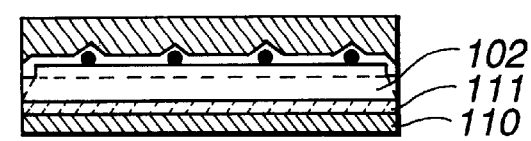

Then, a semiconductor junction 104 was formed in a surface portion of the smooth layer 102 (FIG. 6(c)). For that purpose, first, a PSG (phosphosilicate glass) layer was deposited on the surface of the smooth layer 102 to a thickness of 20 nm at 560° C. by a CVD (chemical vapor deposition) apparatus. The deposited layer was annealed for 30 minutes at 1,050° C. in a nitrogen gas flow in order to diffuse phosphorus (P) into the smooth layer 102 to provide an $n^+$ layer constituting the semiconductor junction 104. Remaining PSG was removed by etching using an aqueous solution of hydrofluoric acid. The surface resistivity of the surface was 0.006 Ω/□.

Process (d)

Since the surface $n^+$ layer of the semiconductor junction 104 formed in the process (c) is also formed in peripheral portions of the substrate, current leakage tends to occur at these portions. Hence, the $n^+$ layer at the peripheral portions of the substrate was removed using a YAG laser having an output of 6 W and a Q-SW to provide a shape as represented by reference numeral 105 shown in FIG. 6(d). Although such processing is usually performed according to dry etching using methane tetrafluoride, oxygen and the like, or wet etching using an etching solution of a hydrofluoric nitric acid type, it becomes unnecessary, for example, to form a mask using the laser beam, and the productivity can be increased.

Process (e)

The resistivity of the $n^+$ layer is not always sufficiently low. Accordingly, in order to collect generated current, copper grid wires 106 100 $\mu$m thick having a conductive adhesive layer coated thereon were bonded by heat on the surface of the $n^+$ layer 105. Although a grid is generally formed by firing a printed conductive-ink pattern, the use of the copper wires 106 allows a high height-to-width ratio of the cross-section and the inherent resistance value of copper can be utilized in contrast to the fired pattern. Hence, a grid having a low resistance value while the area of shadow by incident light is relatively small could be obtained (FIG. 6(e)).

Process (f)

Semiconductor crystals of Si, GaAs and the like generally have high refractive indices and therefore produce a large reflection loss for incident light. Hence, a layer of titanium dioxide was formed as an anti-reflection layer 107. A spray liquid including $TiO(NO_2)_2$ was coated. The coated film was fired at 400° C. in air to form the anti-reflection film 107 about 55 nm thick (FIG. 6(f)). $SnO_2$, ITO (indium tin oxide), ZnO or the like may also be utilized as the material for the anti-reflection layer for the solar cell. However, since titanium dioxide has higher transmittance in the near infrared region and a higher refractive index than these materials, a high efficiency solar cell can be more easily obtained. Furthermore, since the solar cell was formed by coating/firing, a higher productivity could be obtained than when forming the solar cell by CVD, sputtering or the like.

Process (g)

An EVA sheet and an ETFE sheet (product name: TEFZEL) were bonded together as an adhesive on the anti-reflection layer 107 and were pressed at 180° C. for 1 hour to provide a lamination layer 108. Then, when the substrate 100 was chucked by evacuating the backside and the lamination layer 108 was pulled from an end portion thereof, destruction occurred from the inside of the porous layer 103, and a portion above the smooth layer 102 inclusive of the smooth layer 102 was peeled. A residual 109 of the destructed porous layer was present on each of the substrate 100 and the smooth layer 102 which were peeled from each other (FIG. 6(g)).

Process (h)

A stainless-steel plate 110 was bonded on the back of the peeled smooth layer 102 using an aluminum paste 111 as an adhesive, which was cured at 150° C. At that time, the residual 109 of the porous layer at the back of the smooth layer 102 was not intentionally removed. Thus, a solar cell having a lamination on its surface was formed (FIG. 6(h)). The residual 109 of the porous layer 109 remaining on the surface of the substrate layer 120 was removed by etching using an aqueous solution of hydrofluoric acid and was again utilized.

In the solar cell of Example 1, the sunlight is incident upon the $n^+$ layer 105. That is, a main depletion layer is formed in the vicinity of the semiconductor junction 104. Since the residual 109 of the porous layer is a $p^+$ layer, it forms a BSF (backing surface field) with the high-resistance smooth layer 102. The BSF prevents recombination of carriers at the backside to contribute to improvement in the conversion efficiency. The I–V characteristic of the solar cell was measured under light illumination of AM (air mass) 1.5 (100 mW/cm$^2$), and a photoelectric conversion efficiency of 12.6% was obtained. The substrate layer 120 of the substrate 100 reclaimed in the process (g) was returned to the processes (a)–(h) to form a similar solar cell. The I–V characteristic of this solar cell was measured, and a photoelectric conversion efficiency of 12.8% was obtained. Thus, the substrate after surface treatment could be again utilized in the above-described manner. It has become clear that solar cells can be repeatedly manufactured according to the method of the present invention. It has also become clear that the measured photoelectric conversion efficiencies of the solar cells of Example 1 did not change even after bending them to a radius of curvature of 3 cm and are therefore very flexible.

EXAMPLE 2

In Example 2, solar cells were manufactured according to the manufacturing method shown in FIGS. 3(a)–3(d). The manufacturing processes will now be described in detail with reference to FIGS. 7(a)–7(h).

Process (a)

A $p^+$ layer was formed in a single-crystal silicon wafer (substrate) 200 having a thickness of 500 μm, serving as a crystalline substrate, by performing thermal diffusion of boron (B) at 1200° C. using BCl$_3$ as a thermal diffusion source. By forming the $p^+$ layer on a crystalline substrate layer 220, a porous layer having a desired shape is obtained by anodic forming. The $p^+$ layer was subjected to anodic forming in an HF solution under the conditions shown in Table 2 to form a porous silicon layer 201 (FIG. 7(a)).

Table 2

Anodic forming solution: HF:H$_2$O:C$_2$H$_5$OH=1:1:1
Current density: 5 mA/cm$^2$→30 mA/cm$^2$
Time period of anodic forming: 1 min→20 sec Process (b)

Then, the silicon wafer 200 was subjected to heat treatment in a hydrogen atmosphere. First, the wafer 200 was disposed in a quartz tube and was subjected to heat treatment for 30 minutes by raising the temperature to 1,050° C. in an atmospheric pressure hydrogen gas flow. The cross-section of the wafer 200 was observed under a SEM with a magnification of 100,000 before and after the heat treatment in order to see a change in the shape of the porous layer 201. Before the heat treatment, growth of fine pores having diameters of about 10 nm in the direction of the depth of the wafer was observed in a region from the surface to a depth of at least 1 μm of the wafer. Particularly, in a portion having a thickness of about 0.5 μm at the deepest portion of the region it was observed that the diameters of pores were at least twice the diameters of pores in other portions and voids expanded. After the heat treatment, while fine pores were observed in a portion 203 where the diameters of fine pores were initially large, fine pores were not observed in another portion 202. Thus, the smooth layer 202 was formed (FIG. 7(b)). In the portion 203 where the diameters of fine pores were large, initial irregular shapes were transformed into substantially smooth roundish shapes. The crystallinity of the smooth layer 202 was confirmed by electron diffraction to be a single crystal having the same orientation as the substrate 200.

Process (c)

Liquid phase epitaxial growth of silicon was performed on the surface of the smooth layer 202 thus obtained according to a method called a slow cooling method. First, metallic indium (In) was fused within a carbon boat at 900° C. in a hydrogen gas flow. After melting polycrystalline silicon grains in this liquid to saturation while stirring the liquid, phosphorus corresponding to 0.001 atomic % of Si was melted in the solution to provide a solution for growing an $n^-$ layer. When the temperature of the substrate coincided with the temperature of the solution in the hydrogen gas flow, the substrate was immersed in the solution, and an $n^-$ layer 205 having a thickness of 30 μm was deposited on the smooth layer 202 by slowly cooling the solution at a cooling speed of –0.1° C./min to provide a supersaturated state, and the substrate was taken out of the solution. Then, after fusing metallic indium (In) within a separately provided carbon boat at 900° C., the liquid was saturated with Si, and phosphorus corresponding to 0.1 atomic % of Si was melted in the solution to provide a solution for growing an $n^+$ layer. The substrate on which layers up to the $n^-$ layer 205 were formed was immersed in the solution, and an $n^+$ layer 206 having a thickness of 0.5 μm was deposited on the $n^-$ layer 205 by slowly cooling the solution to provide a supersaturated state, and the substrate was taken out from the solution (FIG. 7(c)). In the liquid phase growth method, a phenomenon called meltback, in which the surface of the substrate is more or less melted in the solution at an initial stage of growth, tends to occur. According to the studies by the inventors, while meltback of about 10 nm–100 nm tends to occur unless the degree of supersaturation is strictly controlled, troubles caused by meltback do not occur if the thickness of the smooth layer 202 is controlled to about 0.5 μm as in Example 2.

Process (d)

In constrast to Example 1, in Example 2, a stainless-steel plate 207 was bonded on the surface after completion of growth using an aluminum paste 208, which was then fired. Then, the substrate 200 was chucked, and the stainless-steel plate 207 was pulled from an end portion thereof. The substrate 200 was thereby peeled into two portions at the portion 203 where the porous layer remained (FIG. 7(d)).

A residual 209 of the porous layer remaining on the surface of a substrate layer 220 was removed by etching using an aqueous solution of hydrofluoric acid to reclaim the substrate layer 220 as a substrate.

Process (e)

In contrast to Example 1, in Example 2, the residual 209 of the porous layer on the smooth layer 202 was also removed using an aqueous solution of hydrofluoric acid. Since the porous layer has a large specific surface area, the etching speed for the porous layer is much higher than the etching speed for the smooth layer 202. Hence, the residual 209 could be removed with little damage to the smooth layer 202. Next, as in Example 1, peripheral portions of the smooth layer 202 were scribed by a YAG laser (FIG. 7(e)). The measured value of the surface resistivity of the smooth layer 202 was as low as 0.005 $\Omega/\square$, so that it was confirmed that the smooth layer 202 can be considered a $p^+$ layer.

Process (f)

Figure 7A:
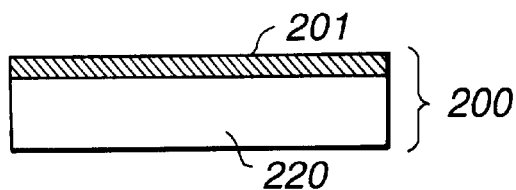
FIGS. 7(a)–7(h) are diagrams illustrating the entire processes for manufacturing a solar cell according to the second embodiment.
Figure 7B:
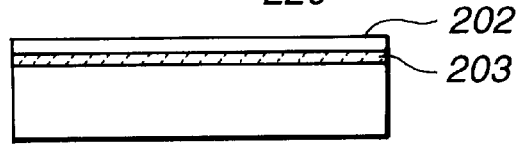
Figure 7C:
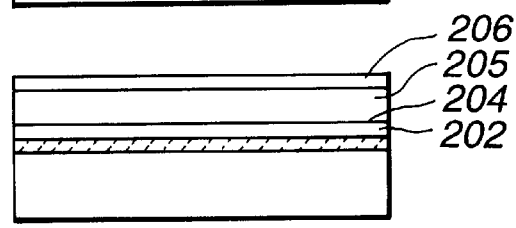
Figure 7D:
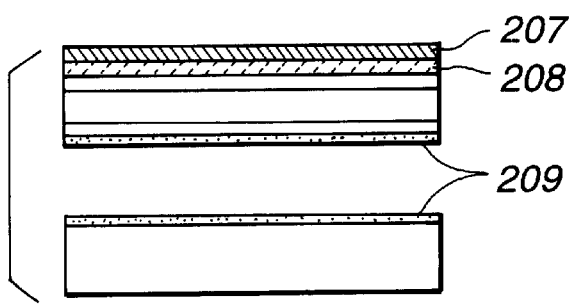
Figure 7E:
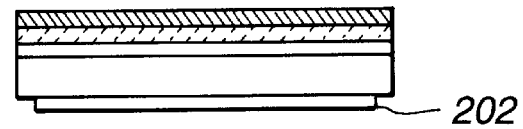
Figure 7F:
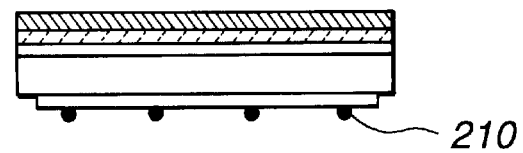

As in Example 1, grid wires 210 were bonded by heat (FIG. 7(f)).

Process (g)

Figure 7G:
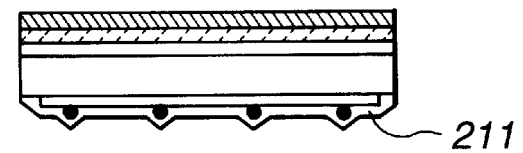

As in Example 1, an anti-reflection layer 211 comprising $TiO_2$ was formed (FIG. 7(g)).

Process (h)

Figure 7H:
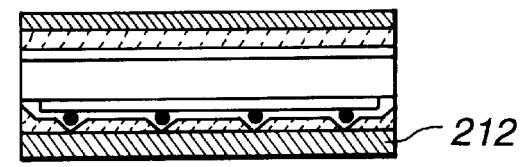

As in Example 1, a solar cell was manufactured by forming a lamination layer 212 (FIG. 7(h)).

In the solar cell of Example 2, the sunlight is incident upon the smooth layer ($p^+$ layer) 202. That is, a main depletion layer is formed in the vicinity of the semiconductor junction 204. The $n^+$ layer provided at the surface side forms a BSF with the $n^-$ layer 205. The BSF prevents recombination of carriers at the $n^+$ layer side to contribute to improvement in the photoelectric conversion efficiency. The I–V characteristic of the solar cell was measured under light illumination of AM 1.5 (100 mW/cm$^2$), and a photoelectric conversion efficiency of 14.7% was obtained. The substrate 200 reclaimed in the process (d) was returned to the processes (a)–(h) to form a similar solar cell. The I–V characteristic of this solar cell was measured, and a photoelectric conversion efficiency of 14.5% was obtained. Thus, the substrate after surface treatment could be returned to the process (a) to be again utilized in the above-described manner. It has become clear that solar cells can be repeatedly manufactured according to the method of the present invention. It has also become clear that the measured photoelectric conversion efficiencies of the solar cells of Example 2 did not change even after bending them to a radius of curvature of 3 cm and are therefore very flexible.

EXAMPLE 3

In Example 3, the solar cell shown in FIGS. 1(a)–1(d) was manufactured according to a method different from the method of Example 1.

Process (a)

A porous layer 101 was formed on the surface of a substrate 100 by anodic forming in the same manner as in Example 1. As shown in Table 3, the forming current was made constant.

Table 3

Anodic forming solution: HF:H$_2$O:C$_2$H$_5$OH=1:1:1
Current density: 5 mA/cm$^2$
Time period of anodic forming: 20 min Process (b)

This substrate was fixed on a stage provided within a chamber capable of being separated from the atmosphere, and a laser beam was projected onto the surface of the substrate using a XeCl excimer laser in an argon atmosphere. The XeCl excimer laser oscillated at 10 Hz with an oscillation wavelength of 308 nm and a pulse width of 35 nsec. After being made uniform, the laser beam was condensed onto an area of about 10×10 mm$^2$ with an intensity of about 10 mJ/cm$^2$. By driving the stage, the entire surface of the porous layer was arranged to be irradiated with the laser beam.

The cross-section of the wafer 100 was observed under a SEM with a magnification of 100,000 before and after the laser beam irradiation in order to see a change in the shape of the porous layer. Before the laser beam irradiation, growth of fine pores having diameters of about 10 nm in the direction of the depth of the wafer was observed in a region from the surface to a depth of at least 20 $\mu$m of the wafer. After uniformly projecting about 100 pulses of the laser beam on the surface of the porous layer by driving the stage, while fine pores were hardly observed in a region 102 near the surface, pores having substantially smooth roundish shapes concentrated in a deep portion 103 irradiated by the laser beam. It is believed that this is because transformation of the porous layer proceeded from the surface where the laser beam having a large intensity was absorbed, and fine pores were piled up at an interface with a portion which was not subjected to anodic forming. Thus, the smooth layer 102 was formed.

The crystallinity of the smooth layer 102 was confirmed by electron diffraction to be a single crystal having the same orientation as the substrate 100. The smooth layer 102 formed in the above-described manner was peeled by attaching an adhesive tape on the surface thereof, and the resistivity of the smooth layer 102 was measured to be about 0.1 $\Omega$cm. While the porous layer 101 was originally a $p^+$ layer, the resistivity of the smooth layer 102 was slightly higher than the resistivity of the ordinary $p^+$ layer. This suggests the posibility that the dopant migrated into the smooth layer 102 in the course of transformation into the smooth layer 102 to provide a low concentration.

However, the above-described smooth layer is relatively lower in function as a $p^-$ layer used for a semiconductor junction for a solar cell. Hence, when performing laser beam irradiation, phosphorus pentafluoride (PF$_5$) having a concentration of 10 ppm was mixed in an argon gas flow in order to provide a layer which is closer to an intrinsic layer, and a resistivity of 1 cm was obtained. The smooth layer 102 obtained in this condition was hereafter used. In the method of Example 3, it is unnecessary to provide a distribution in the diameters of pores of the porous layer by anodic forming. In the method for forming a layer having large fine pores by controlling the forming current, particularly when the porous layer is thick, the porous layer, in some cases, peels during anodic forming if accuracy in the current control is inferior. In Example 3, however, fine pores did not become extremely large, and reproducibility of peeling could easily be obtained.

A solar cell was manufactured by executing processes (c)–(h) in the same manner as in Example 1.

The I–V characteristic of the solar cell was measured under light illumination of AM 1.5 (100 mW/cm$^2$), and a photoelectric conversion efficiency of 11.5% was obtained. The substrate 100 reclaimed in the process (g) was returned to the processes (a)–(h) to form a similar solar cell. The I–V characteristic of this solar cell was measured, and a photoelectric conversion efficiency of 11.7% was obtained. It has become clear that solar cells can be repeatedly manufactured by reutilizing the substrate according to the method of the present invention. It has also become clear that the measured photoelectric conversion efficiencies of the solar cells of Example 3 did not change even after bending them to a radius of curvature of 3 cm and are therefore very flexible.

EXAMPLE 4

In Example 4, the solar cell shown in FIGS. 2(a)–2(d) was manufactured according to a method different from the method of Example 2.

Process (a)

A porous layer 201 was formed on the surface of a substrate 200 by anodic forming in the same manner as in Example 2. As shown in Table 4, the forming current was made constant.

Table 3

Anodic forming solution: $HF:H_2O:C_2H_5OH=1:1:1$
Current density: 5 mA/cm$^2$
Time period of anodic forming: 1 min Process (b)

This substrate was fixed on a stage provided within a vacuum chamber in which an electron gun is provided. After evacuating the chamber to a vacuum of $1.3 \times 10^{-4}$ Pa, an electron beam was projected onto the surface of the substrate. The acceleration voltage of the electron beam was 5 kV, and the electron beam current was 0.5 A. The electron beam scanned the substrate at 10 Hz within a range of 20×20 mm$^2$.

The cross-section of the wafer was observed under a SEM with a magnification of 100,000 before and after the electron beam irradiation in order to see a change in the shape of the porous layer. Before the electron beam irradiation, growth of fine pores having diameters of about 10 nm in the direction of the depth of the wafer was observed in a region from the surface to a depth of at least 1 μm of the wafer. After uniformly projecting about 10 pulses of the electron beam on the surface of the porous layer by driving the stage, while fine pores were hardly observed in a region 102 near the surface, pores having substantially smooth roundish shapes concentrated in a deep portion 103. It is believed that this is because transformation of the porous layer proceeded from the surface where the electron beam was strongly absorbed, and fine pores were piled up at an interface with a portion which was not subjected to anodic forming. Thus, the smooth layer 102 was formed.

The crystallinity of the smooth layer 202 was confirmed by electron diffraction to be a single crystal having the same orientation as the substrate 100. In Example 4, while the smooth layer 102 desirably has a low resistivity because it is used as a p$^+$ layer, there is the possibility that the resistivity of the smooth layer 102 increases by electron beam irradiation. Hence, when performing electron beam irradiation, B was doped by flowing boron fluoride (BF$_3$) diluted to 5% with hydrogen in the vacuum chamber at a pressure of $1.3 \times 10^{-3}$ Pa. The smooth layer obtained in this method seemingly had better surface flatness when observed under a SEM. This is estimated to be the effect of the flow of a small amount of hydrogen when performing electron beam irradiation. The smooth layer 202 obtained under this condition was hereafter used.

A solar cell was manufactured by executing processes (c)–(h) in the same manner as in Example 2.

The I–V characteristic of the solar cell was measured under light illumination of AM 1.5 (100 mW/cm$^2$), and a photoelectric conversion efficiency of 13.5% was obtained.

The substrate 100 reclaimed in the process (d) was returned to the processes (a)–(h) to form a similar solar cell. The I–V characteristic of this solar cell was measured, and a photoelectric conversion efficiency of 13.2% was obtained. It has become clear that solar cells can be repeatedly manufactured by reutilizing the substrate according to the method of the present invention. It has also become clear that the measured photoelectric conversion efficiencies of the solar cells of Example 4 did not change even after bending them to a radius of curvature of 3 cm and are therefore very flexible.

EXAMPLE 5

In Example 5, a solar cell using a compound semiconductor was manufactured according to the method of the present invention. The manufacturing processes will now be described with reference to FIGS. 6(a)–6(h).

Process (a)

A single-crystal Si-doped n-type gallium arsenide wafer 100 having a thickness of 500 μm, serving as a crystalline substrate, was subjected to anodic forming under the conditions shown in Table 5, to form a porous layer 101 (FIG. 6(a)).

Table 1

Anodic forming solution:
$H_2SO_4$=0.1 M aqueous solution
HCl=0.1 M aqueous solution
Current density: 5 mA/cm$^2$ → 50 mA/cm$^2$
Time period of anodic forming: 4 min → 8 sec Process (b)

Then, the gallium arsenide wafer 100 was subjected to heat treatment in a hydrogen atmosphere. First, the wafer 100 was disposed in a quartz tube and was subjected to heat treatment for 30 minutes by raising the temperature to 850° C. in an atmospheric pressure hydrogen gas flow. The cross section of the wafer 100 was observed under a SEM with a magnification of 100,000 before and after the heat treatment in order to see a change in the shape of the porous layer 101. Before the heat treatment, growth of fine pores having diameters of about 10 nm in the direction of the depth of the wafer was observed in a region from the surface to a depth of at least 2 μm of the wafer. Particularly, in a portion having a thickness of about 0.5 μm at the deepest portion of the region, it was observed that the diameters of pores were at least twice the diameters of pores in other portions and voids expanded. It is believed that such large diameter pores were formed when increasing the current density to 50 mA/cm$^2$ in the process of anodic forming. After the heat treatment, while fine pores were observed in a portion 103 where the diameters of fine pores were initially large, fine pores were not observed in another portion 102. Thus, the smooth layer 102 was formed (FIG. 6(b)). In the portion 103 where the diameters of fine pores were large, initial irregular shapes were transformed into substantially smooth roundish shapes. The crystallinity of the smooth layer 102 was confirmed by electron diffraction to be a single crystal having the same orientation as the substrate 100.

The smooth layer 102 formed in the above-described manner was peeled by attaching an adhesive tape on the surface thereof, and the conductivity type was confirmed according to a thermoelectromotive force method to be a p type. It is believed that this is because, while the substrate was originally an n type, Si atoms which had occupied the lattice points of Ga atoms moved to occupy the lattice points of As atoms.

Process (c)

Then, the semiconductor junction 104 was formed on the surface of the smooth layer 102 (FIG. 6(c)). First, this substrate was fixed on a stage provided within a chamber capable of being separated from the atmosphere, and a laser beam was projected onto the surface of the substrate using a XeCl excimer laser in an argon atmosphere. The XeCl excimer laser oscillated at 10 Hz with an oscillation wavelength of 308 nm and a pulse width of 35 nsec. After being made uniform, the laser beam was condensed onto an area of about 10×10 mm$^2$ with an intensity of about 150 mJ/cm$^2$. By driving the stage, the entire surface of the porous layer was arranged to be irradiated with the laser beam. Thus, the smooth layer 102 was formed. The photoelectromotive force of the smooth layer 102 was measured by a surface potential meter for low potential while projecting a laser spot on the surface. Although little photoelectromotive force appeared before projecting the laser beam, a photoelectromotive force of −0.5 V appeared after projecting the laser beam. It is considered that this is because Si atoms which had occupied the lattice points of As atoms moved to occupy the lattice points of Ga atoms in the vicinity of the surface of the smooth layer formed by absorbing a large intensity laser beam, due to the function of temperature, to transform the initial p-type region into an n$^+$ region which formed the semiconductor junction 104 with the remaining p-type region. According to the method of the process (c), it has become clear that diffusion, deposition of a layer having a different conductivity type, or the like becomes unnecessary, and particularly, and it is possible to easily form a semiconductor junction.

A solar cell was manufactured by performing processes (d)–(h) in the same manner as in Example 1.

In the solar cell of Example 5, the sunlight is incident upon the n$^+$ layer 105. That is, a main depletion layer is formed in the vicinity of the semiconductor junction 104. The I–V characteristic of the solar cell was measured under light illumination of AM 1.5 (100 mW/cm$^2$), and a photoelectric conversion efficiency of 15.6% was obtained. The substrate 100 reclaimed in the process (g) was returned to the processes (a)–(h) to form a similar solar cell. The I–V characteristic of this solar cell was measured, and a photoelectric conversion efficiency of 15.5% was obtained. It has become clear that solar cells can be repeatedly manufactured according to the method of the present invention. It has also become clear that the measured photoelectric conversion efficiencies of the solar cells of Example 5 did not change even after bending them to a radius of curvature of 2 cm and are therefore very flexible. Since the solar cell of Example 5 uses GaAs which is a direct-transition-type semiconductor, light is strongly absorbed so that sufficient sunlight could be absorbed even if the thickness is about 2 μm. That is, the superiority of the method of the present invention in cost is pronounced compared with the case of using a crystal in a state of a thick substrate.

As described above, according to the present invention, it is possible to form a high efficiency thin-film crystalline solar cell on an inexpensive and flexible substrate with simple processes. Hence, the use of solar cells can be widened. According to the present invention, after peeling a thin-film crystalline solar cell having excellent characteristics from a substrate, the substrate is recalled so as to be repeatedly used. It is thereby possible to effectively utilize a material and to reduce the production cost of a solar cell.

The individual components shown in outline in the drawings are all well-known in the semiconductor device and the semiconductor-device manufacturing method arts, and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a semiconductor device comprising the steps of:
   (a) forming a porous layer including a large number of fine pores in a surface portion of a crystalline substrate to a predetermined thickness;
   (b) transforming a part of the porous layer including the surface thereof into a crystalline smooth layer which does not substantially include fine pores;
   (c) forming a semiconductor junction between the crystalline smooth layer and a crystalline layer by forming the crystalline layer on the surface of the crystalline smooth layer; and
   (d) peeling the smooth layer from the crystalline substrate at a portion of the porous layer which has not been transformed into the smooth layer.

2. The method according to claim 1, wherein the formation of the crystalline layer comprises a liquid-phase growth method.

3. The method according to claim 1, wherein the step of transforming the porous layer into the smooth layer comprises heat treatment in a hydrogen atmosphere.

4. The method according to claim 1, wherein the step of transforming the porous layer into the smooth layer comprises energy radiation from the surface of the porous layer.

5. The method according to claim 1, wherein the step of transforming the porous layer into the smooth layer comprises energy radiation from the surface of the porous layer.

6. The method according to claim 5, wherein the energy radiation comprises an electromagnetic wave having a wavelength equal to or less than 600 nm.

7. The method according to claim 5, wherein the energy radiation comprises an electron beam.

8. The method according to claim 1, wherein the semiconductor device comprises a solar cell.

9. The method according to claim 8, further comprising the step of (d) bonding grid wires on the semiconductor of the smooth layer peeled from the crystalline substrate, and laminating an anti-reflection layer and a lamination layer on the grid wires.

10. The method according to claim 9, further comprising the step of (e) bonding a metallic plate on the back of the peeled smooth layer.

11. The method according to claim 1, wherein the crystalline substrate from which the smooth layer has been peeled is again utilized as the crystalline substrate in said step (a).

12. The method according to claim 1, wherein the thickness of the smooth layer is controlled to prevent troubles caused by meltback.

13. The method according to claim 1, wherein the step of transforming the porous layer into the smooth layer comprises controlling the concentration of dopant in the smooth layer.

* * * * *

UNITED STATES PATENT AND TRADEMARK OFFICE
CERTIFICATE OF CORRECTION

PATENT NO.    : 6,211,038 B1                                                      Page 1 of 1
DATED         : April 3, 2001
INVENTOR(S)   : Katsumi Nakagawa et al.

It is certified that error appears in the above-identified patent and that said Letters Patent is hereby corrected as shown below:

Column 6,
Line 39, "arid" should read -- and --.

Column 12,
Line 40, "posibility" should read -- possibility --.

Column 14,
Line 34, "cross" should read -- cross --.

Column 16,
Line 34, "com-" should read -- changes the sizes of the fine pores from the crystalline substrate toward --; and
Line 35, "prises energy radiation" from" should be deleted.

Signed and Sealed this

Sixth Day of August, 2002

*Attest:*

*Attesting Officer*

JAMES E. ROGAN
*Director of the United States Patent and Trademark Office*